US006842376B2

(12) United States Patent
Matsuzaki et al.

(10) Patent No.: US 6,842,376 B2
(45) Date of Patent: *Jan. 11, 2005

(54) NON-VOLATILE SEMICONDUCTOR MEMORY DEVICE FOR SELECTIVELY RE-CHECKING WORD LINES

(75) Inventors: Nozomu Matsuzaki, Kokubunji (JP); Kazuyoshi Shiba, Kodaira (JP); Yasuhiro Taniguchi, Kodaira (JP); Toshihiro Tanaka, Akiruno (JP); Yutaka Shinagawa, Irumak (JP)

(73) Assignees: Renesas Technology Corporation, Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/638,491

(22) Filed: Aug. 12, 2003

(65) Prior Publication Data
US 2004/0047223 A1 Mar. 11, 2004

Related U.S. Application Data

(63) Continuation of application No. 10/223,488, filed on Aug. 20, 2002, which is a continuation of application No. 09/986,081, filed on Nov. 7, 2001, now Pat. No. 6,459,619.

(30) Foreign Application Priority Data

Nov. 8, 2000 (JP) ........................................ 2000-345455

(51) Int. Cl.$^7$ ............................ G11C 16/04; G11C 16/06

(52) U.S. Cl. ............................ 365/185.18; 365/185.19; 365/185.29; 365/185.3

(58) Field of Search ........................ 365/185.18, 185.19, 365/185.29, 185.3

(56) References Cited

U.S. PATENT DOCUMENTS

| 5,642,309 A | 6/1997 | Kim et al. ............. 365/185.22 |
| 5,991,201 A | 11/1999 | Kuo et al. ............. 365/185.18 |
| 6,014,330 A | 1/2000 | Endoh et al. .......... 365/185.18 |
| 6,381,178 B1 | 4/2002 | Kodama ................ 365/185.18 |

FOREIGN PATENT DOCUMENTS

| JP | 8-96591 | 9/1995 |
| JP | 10-228784 | 2/1997 |

*Primary Examiner*—Trong Phan
(74) *Attorney, Agent, or Firm*—Reed Smith L.L.P.; Stanley P. Fisher, Esq.; Juan Carlos A. Marquez, Esq.

(57) ABSTRACT

A method for settling threshold voltages of word lines on a predetermined level in an erasing processing of a non-volatile semiconductor memory device so as to speed up the erasing processing. A word latch circuit is provided for each word line and the threshold voltage of each memory cell is managed for each word line in a selected memory block. Each word latch circuit is shared by a plurality of word lines so as to reduce the required chip area. A rewriting voltage is set for each finished non-volatile memory and the voltage information is stored in the boot area of the non-volatile memory, so that the voltage is recognized by the system each time the system is powered.

3 Claims, 8 Drawing Sheets

NON-VOLATILE SEMICONDUCTOR MEMORY DEVICE FOR SELECTIVELY RE-CHECKING WORD LINES

This application is a continuation application of U.S. application Ser. No. 10/223,488 filed on Aug. 20, 2002 which is a continuation of U.S. application Ser. No. 09/986,081 filed on Nov. 7, 2001, now U.S. Pat No. 6,459,619.

FIELD OF THE INVENTION

The present invention relates to an inflicting voltage controlling method employed for the erasing processing for a non-volatile semiconductor memory device and a non-volatile semiconductor memory device that employs the method.

BACKGROUND OF THE INVENTION

A floating gate electrode type non-volatile memory element (hereinafter "cell") stores information according to a different cell characteristic decided by the number of electrons accumulated in their floating gate electrodes, i.e. a difference between threshold voltage values of the cells. Hereinafter, a processing for increasing a threshold voltage is defined as "writing" and a processing for decreasing the threshold voltage to a predetermined value is defined as "erasing". Accordingly, the processing for increasing the threshold voltage is defined as "erasing" and the processing for decreasing the threshold voltage to a predetermined value is defined as "write".

FIG. 2 shows a graph for denoting distribution of threshold voltages of the cells of a general non-volatile semiconductor memory device in which each memory array is composed of a plurality of cells. A writing level is decided by the writing lower limit value $V_{pmin}$ and the threshold voltages are distributed as denoted by A. In an erasing processing, a predetermined voltage is inflicted to the cell group set in the state of distribution A so as to lower each respective threshold voltage. Usually, because the erasing characteristic is varied, when a processing for lowering a threshold voltage is executed simply as such, the threshold voltages are distributed in a wide-base shape as denoted by B. A cell group (dark portion) of which the threshold voltage is under the erasing lower limit value $V_{emin}$ (over erasing level) becomes a source of leak current, thereby information cannot be read therefore correctly. In order to prevent such a problem, therefore, the data in each cell on the over erasing level is rewritten so that the erasing level is adjusted to a predetermined erasing level distribution C (within a range between the erasing lower limit value $V_{emin}$ and the erasing upper limit value $V_{emax}$).

Conventionally, there have been two methods for lowering threshold voltages: one is a method for managing a plurality of word lines collectively (hereinafter, to be described as the "block processing") and the other is a method for managing the threshold of each cell in units of a word line (hereinafter, to be described as the "sector processing"). In the case of the block processing, a target block including a plurality of word lines is selected according to the information stored in the corresponding register. For example, a well potential is used as a block selecting signal and a negative voltage is inflicted to all the word lines in the selected block. The charge accumulated in a cell is discharged with an electric field generated by the negative voltage and a positive potential inflicted to the well. Then, the threshold voltage of each cell is checked. When there is a cell of which threshold voltage is not under the reference value, a negative voltage is inflicted again to all the word lines in the block. These processings are repeated. When the threshold voltages of all the cells in the block become lower than the reference value, the system goes to the next block so as to execute another erasing processing. Because the block processing can process many cells at a time, it takes less time for lowering each threshold voltage.

The sector processing manages the threshold voltage of each cell in units of a word line. After a negative voltage is inflicted to a word line, the threshold voltage of the cell connected to the word line is checked. When a cell of which threshold voltage is not under the reference value is detected, a negative voltage is inflicted again to the word line. When the threshold voltage of every cell connected to the word line goes under the reference value, the system goes to the next word line. In the case of this method, a negative voltage for lowering each threshold voltage is inflicted to just the number of cells connected to a word line. Statically, the fewer the word lines, the narrower the threshold voltage distribution after a processing can be than that of the block erasing processing. On the other hand, when compared with the block processing, the processing time becomes longer unavoidably.

Furthermore, after an erasing processing executed for a cell, another processing is done so as to increase the threshold voltage of the cell, which has been decreased excessively. This processing is referred to as "rewriting". In any of the block processing and the sector processing described above, it cannot be avoided that some cells go into such the over erased state after an erasing processing. This is why such the rewriting is done as "a weak writing" for the cells that are in the over erased state. Because the writing characteristic is varied just like the erasing characteristic, the threshold voltages must be controlled precisely so that they are settled on a predetermined erasing level shown in FIG. 2.

There is a well-known method for inflicting a voltage to cells so as to write data therein accurately. According to the method, a pulse voltage inflicted to both drain and gate of each cell is increased by increments through the hot electron injection method. The threshold voltages of cells in which data can be written fast can be controlled easily and settled on a predetermined erasing level at the initial infliction of a low voltage. On the other hand, the threshold voltages of cells in which data is written slowly at a low voltage are controlled so as to be settled quickly on the predetermined erasing level by a high voltage inflicted in the latter half. Such the writing voltage inflicting method is disclosed in U.S. Pat. No. 5,642,309 and JP-A-Nos. 228784/1998.

In the case of the block processing, since there are many target cells, the threshold voltages are distributed widely and the number of cells to be set in the over erased state increases after each processing, suffering from the increase in rewriting processing time. In the case of the sector processing, a processing for inflicting a voltage used to lower a threshold voltage must be executed for each of word lines, causing the voltage inflicting time to increase. In order to reduce the whole erasing processing time, it is required to reduce both processing times for lowering each threshold voltage and rewriting data. In principle, however, it has been difficult for any of the conventional block and sector processings to reduce both of such the processing times.

Under such circumstances, it is an object to provide a method that enables rewiring to be done so that threshold voltages of memory cells are settled easily on a predetermined level. In order to achieve the above object, the writing pulse voltage is increased by increments for rewriting. And, a minimum level, a maximum value, an increment value, and a pulse time should be set property for each voltage to be inflicted. When there is an exessively high stress recognized on the pulse voltage value. (for example, when the start voltage is excessively high), in which cells data can be rewritten first might exceed the upper limit value of the erasing level. When the start voltage is excessively low or when the maximum inflicting voltage is excessively low, the rewriting is done slowly which causes the processing time to increase. Setting pulses of the voltage to be inflicted is also an important item to solve the above conventional problems.

SUMMARY OF THE INVENTION

Word lines in a selected block, when their threshold voltages are within a proper range in an erasing processing, are excluded from an additional erasing processing respectively. Whether to select a word line for such an additional erasing processing is done by controlling a latch circuit connected to the word line according to the information of processing end stored in a register. The subject memory is prevented from an increase of the occupied area by enabling the latch circuit to be shared by other word lines.

When in a rewriting processing, a voltage is inflicted so as to increase by increments. And, an initial value, a final value, an increment value, and a pulse width can be set for this voltage. Each of those values is selected for each finished non-volatile memory device in accordance with the characteristic thereof. The selected conditions are stored in the memory chip as non-volatile information and read from the chip and used each time the system is powered.

Other and further objects, features and advantages of the invention will appear more fully from the following description.

BRIEF DESCRIPTION OF THE DRAWINGS

A preferred embodiment of the present invention illustrated in the accompanying drawings in which.

DETAILED DESCRIPTION OF THE PREFERRED EMBODIMENTS

Hereunder, the preferred embodiment of the present invention will be described with reference to the accompanying drawings.

Figure 3:
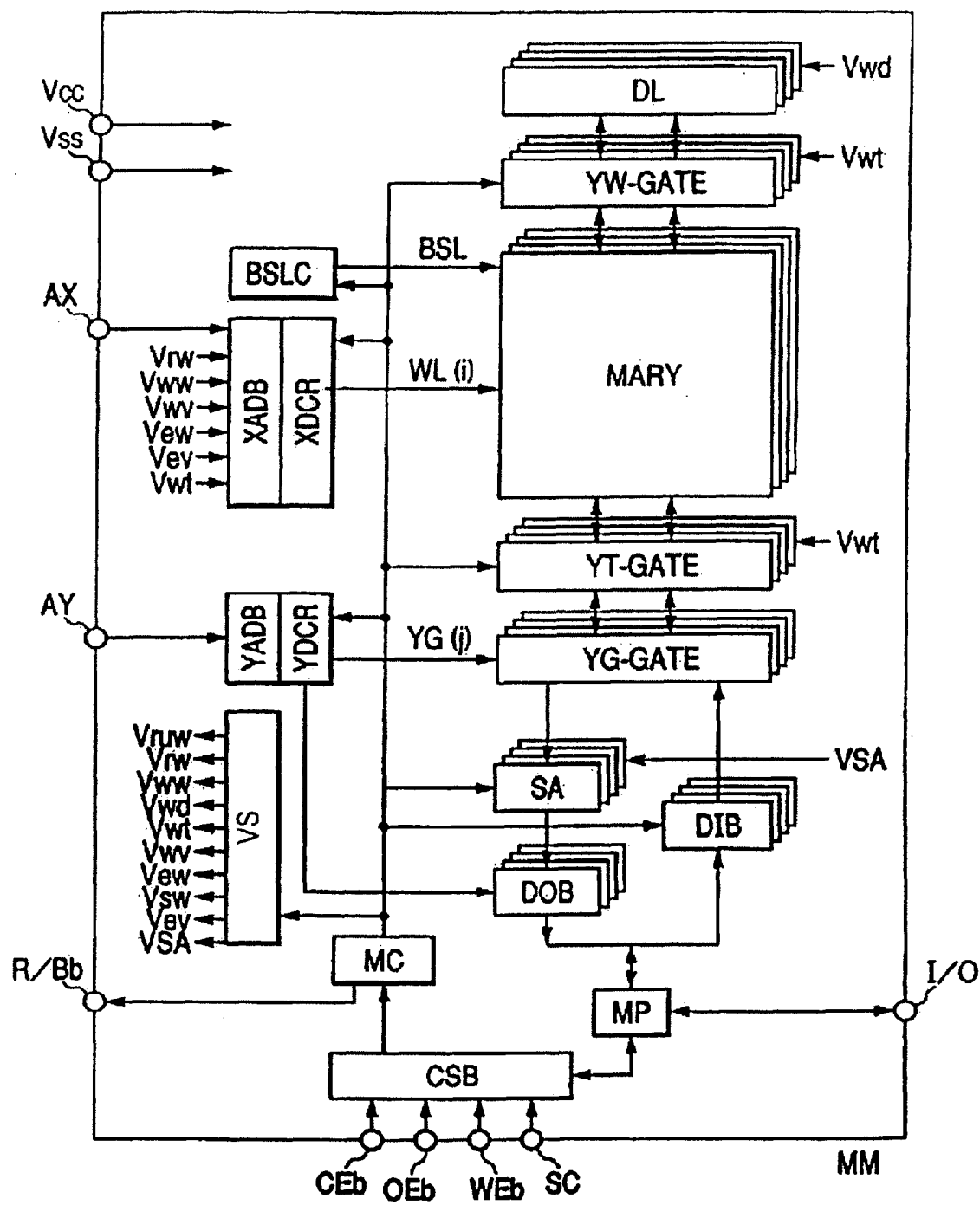
FIG. 3 is a block diagram of a non-volatile semiconductor memory device in FIG. 1.

FIG. 3 shows a block diagram of a non-volatile semiconductor memory device (memory module MM). A memory array MARY comprises memory cells disposed like a matrix. The threshold voltage of each memory cell can be raised/lowered electrically. The memory module MM includes a row address buffer XADB, a row address decoder XDCR, a data latch circuit DL, a sense amplifier circuit SA, column gate array circuits YG-Gate, YW-Gate, YT-Gate, a column address buffer YADB, a column address decoder YDCR, a block selecting control circuit BSLC, an input buffer circuit DIB, an output buffer circuit DOB, a multiplexer circuit MP, a mode control circuit MC, a control signal buffer circuit CSB, a built-in power supply circuit VS, a block selecting control signal BSL, word lines WL(i), column gate signal lines YG(i), an input/output signal I/O, a read un-selecting word voltage Vruw, a read selecting word line voltage Vrw, a write word line voltage Vww, a write data line voltage Vwd, a write transfer column gate voltage Vwt, a write verify word line voltage Vwv, an erase word line voltage Vew, an erase source well voltage Vsw, an erase verify word line voltage Vev, and a sense amplifier voltage VSA, etc.

The control signal buffer circuit CSB receives at least one of the chip enable signal CEb, the output enable signal OEb, the write enable signal WEb, and the serial clock signal SC, etc so as to output timing signals used for triggering internal control signals. The mode control circuit MC outputs ready/busy signals to the external terminal R/Bb. The built-in power supply circuit VS receives a supply voltage Vcc from an external source then outputs voltages required for writing, erasing, and reading. The row/column address buffer XADB/YADB receives a row/column address signal AX/AY from an external terminal so as to generate and output an address signal to the row/column address decoder XDCR/YDCR.

Figure 1:
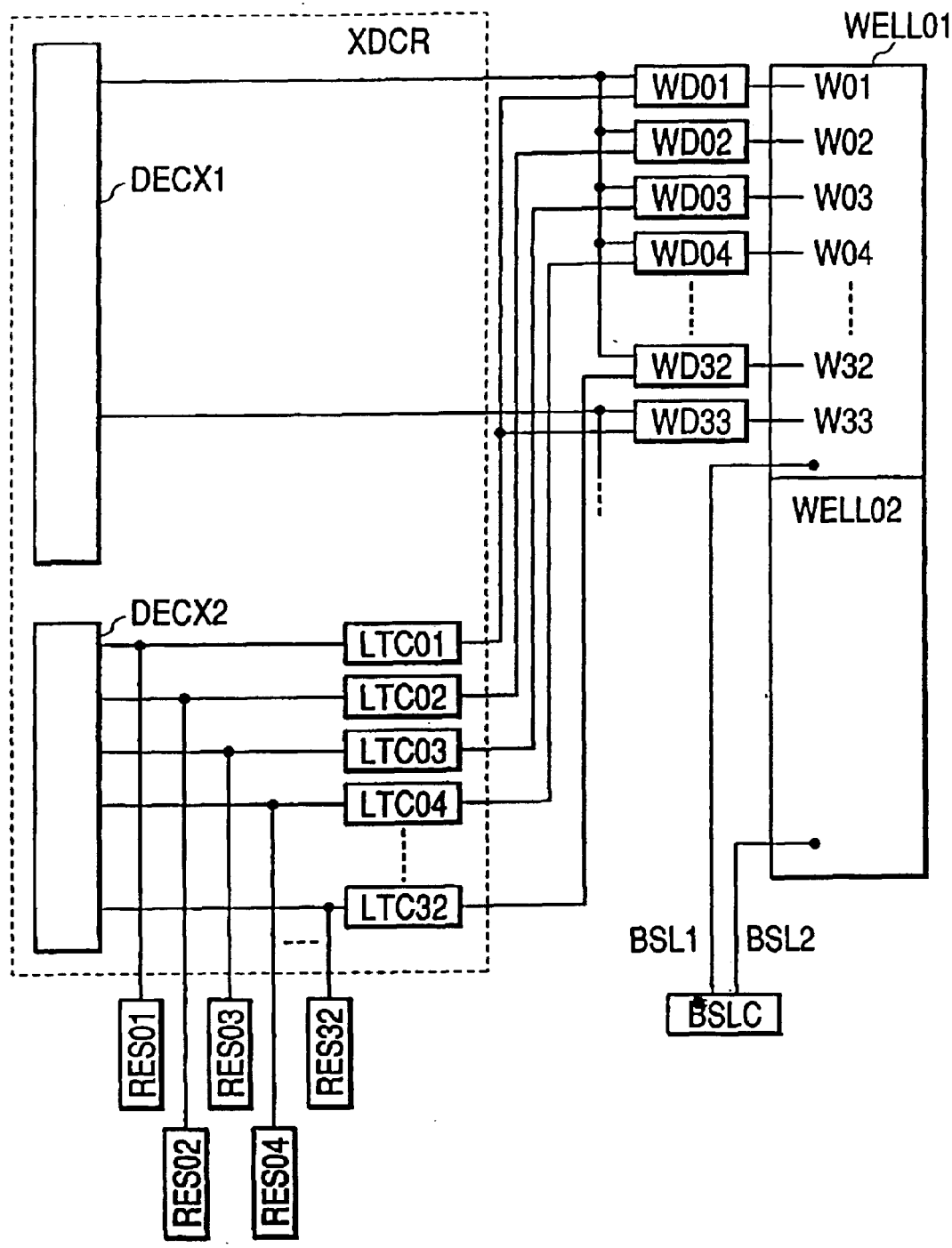
FIG. 1 is a block diagram of a non-volatile memory of the present invention.
Figure 2:
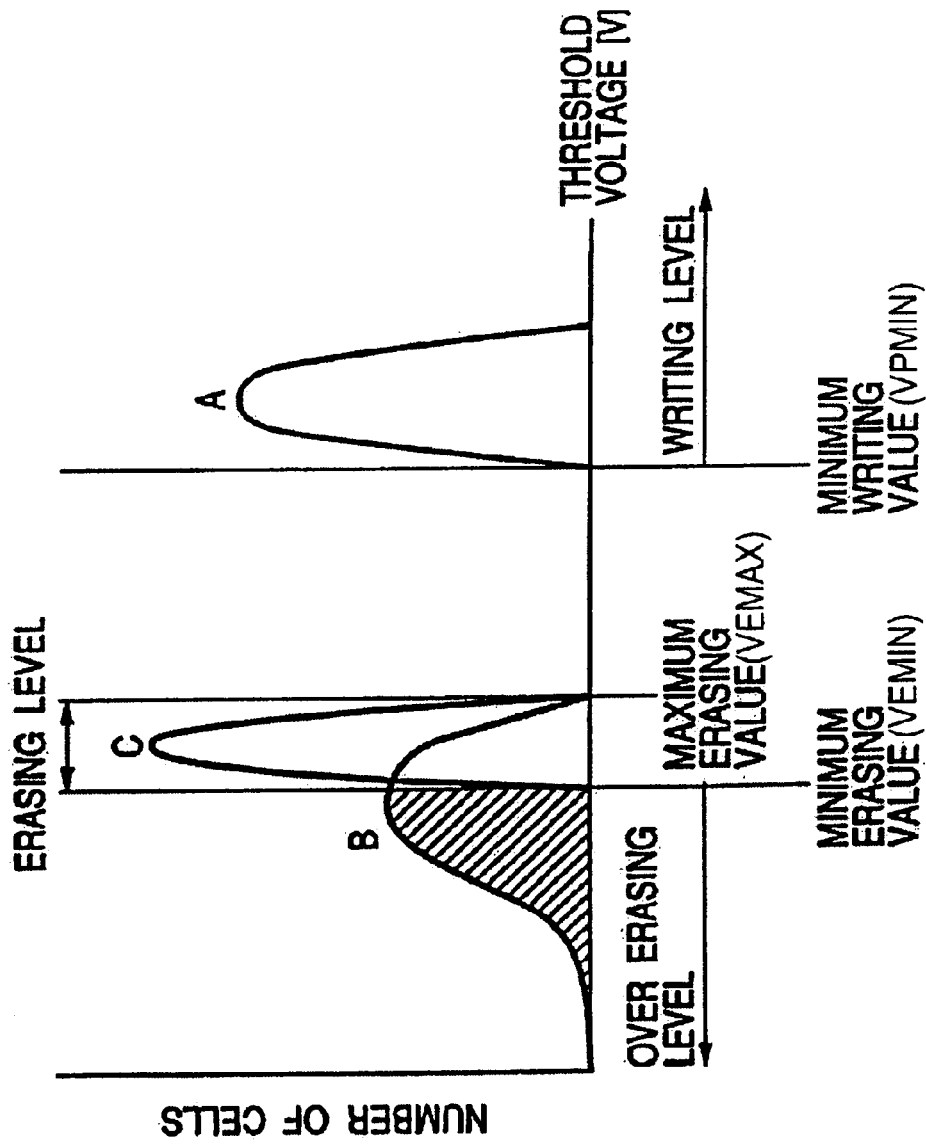
FIG. 2 is a graph denoting the distribution of threshold voltages on the "writing" level and on the "erasing" level of the non-volatile memory in FIG. 1 respectively.

FIG. 1 shows a block diagram denoting the word line latching method of the present invention. The memory array MARY has wells WELL01 and WELL02 separated electrically from each other. A well is a divided area provided with a plurality of word lines W01 to W33. The word lines W01 to W33 are driven by word drivers WD01 to WD33. Each well is selected by a block selecting signal BSL1 and BSL2 issued from the block selecting control circuit BSLC.

The row address decoder XDCR includes an erasure unit selecting decoder DECX1, a word line selecting decoder DECX2, and latches LTC01 to LTC32. In this embodiment, an erasing processing is done for 32 word lines at a time, so that the erasure unit selecting decoder DECX1 selects 32 word lines at a time while the word line selecting decoder DECX2 selects each of those 32 word lines. In addition, registers RES01 to RES32 are provided in the controller or CPU for controlling the erasure of data from the memory corresponding to the latches LTC01 to LTC32.

Figure 4:
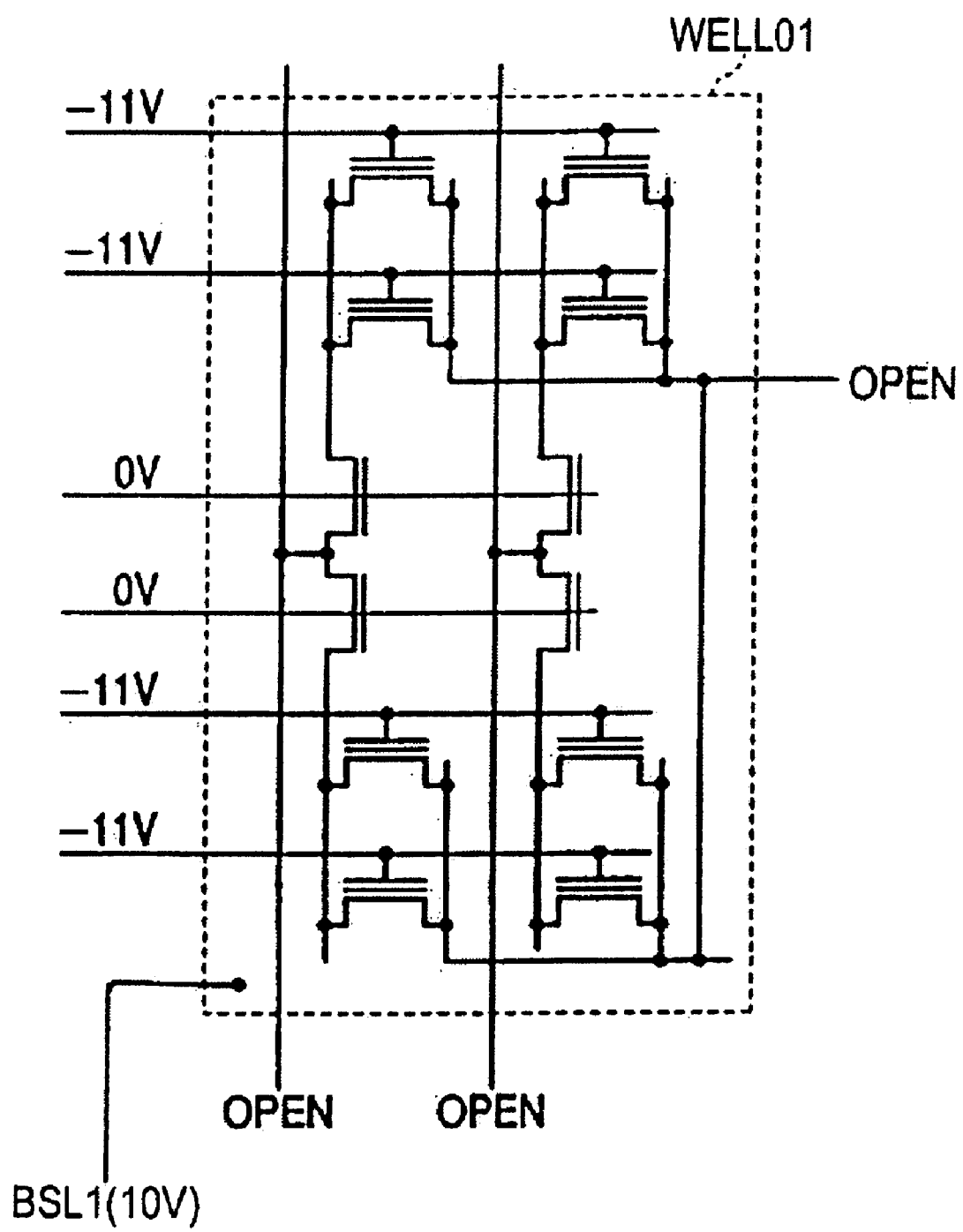
FIG. 4 is a circuit diagram denoting a relationship between voltages inflicted so as to erase data from the non-volatile memory.

A cell group in an area decided by the well WELL01 forms a block. In this embodiment, word lines W01 to W32 are included in the first erasure unit. The block selecting signal BSL1 decides whether to select each block depending on whether the signal takes a positive potential 10V or 0V. FIG. 4 shows how a voltage is inflicted to a memory to a memory block so as to erase data therein. An electric field formed by a negative voltage (−11V) inflicted to subject word lines and a positive voltage (10V) inflicted to the well WELL01 through the block selecting signal BSL1 is used to discharge the accumulated charge from a cell to the board. At this time, a common source line and bit lines are open, and the potentials of the control lines of transistors connected to the bit lines are 0V.

The circuit configuration of the present invention is characterized in that the latch circuits LTC01 to LTC32 are shared by word lines other than the word lines W01 to W32. This means that a latch circuit is shared by a plurality of word lines included in different erasure units. In FIG. 1, the latch LTC01 is shared by a word line W01 and a word line W33 included in different erasure units. An increase of the chip area caused by a latch circuit LTC is a direct product of the area per latch circuit and the number of latch circuits. In this embodiment, because a latch circuit is shared by a plurality of erasure units, the chip area of the subject non-volatile memory is not increased due to the employment of latch circuits.

Although an erasure unit consists of 32 word lines in FIG. 1, the number of word lines is not limited only to 32 per an erasure unit. Although one memory block includes a plurality of erasure units in the above embodiment, one block may include only one erasure unit. In this case, the configuration effectively eliminates the disturbance caused by infliction of a positive voltage to a well in erasing data therefrom. On the other hand, this configuration suppresses the increase of the memory array area, which is caused by dividing the well.

Figure 5:
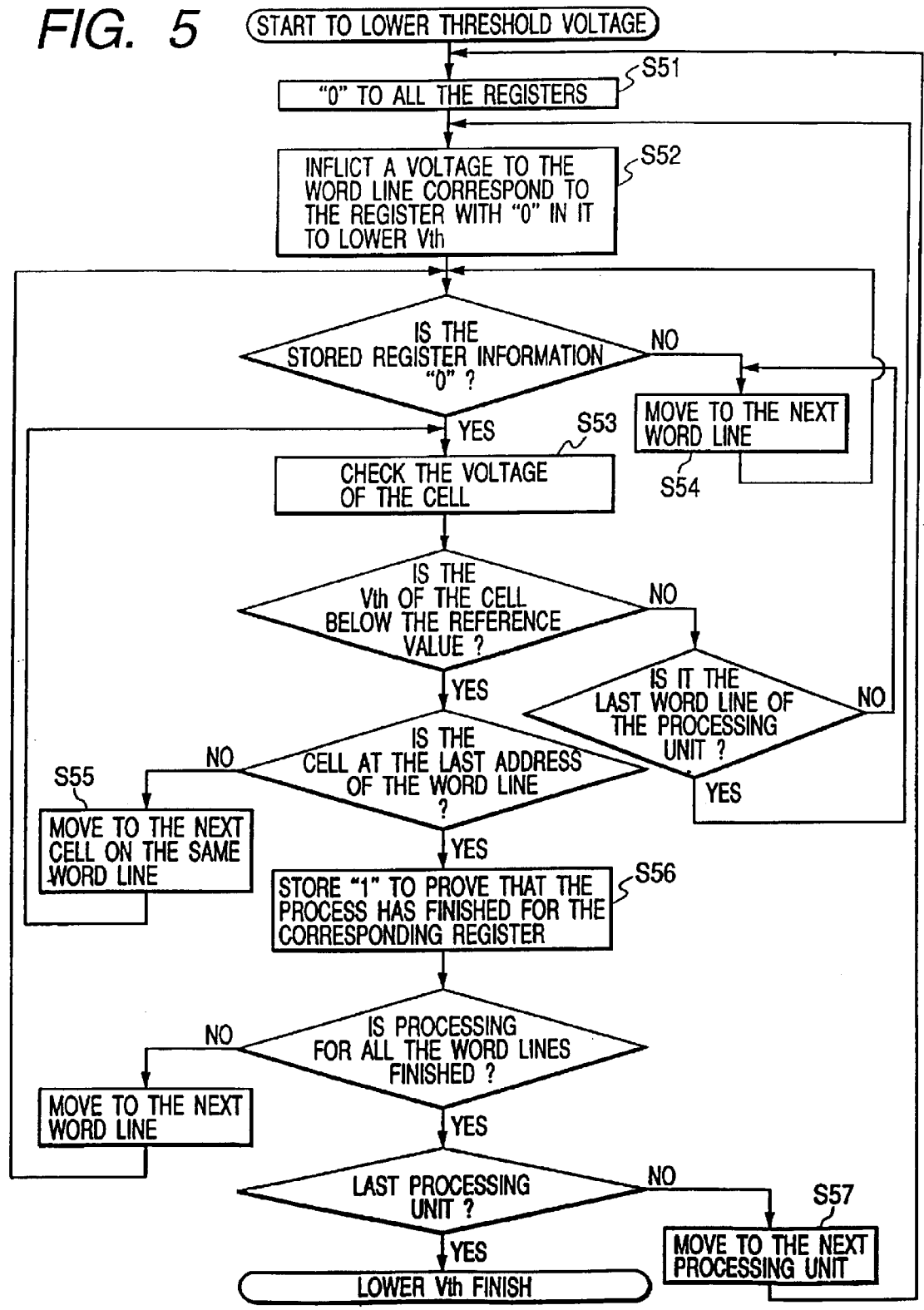
FIG. 5 is a flowchart of the processing of lowering a threshold voltage in a cell of the non-volatile memory in FIG. 1.

Next, how to erase data from a block will be described with reference to the flowchart shown in FIG. 5. At first, the registers RES01 to 32 are all cleared to "0" (S51). Then, the positive potential of a block selecting signal, such as 10V, is supplied via the BSL to the well WELL01 of the block that includes the erasing-targeted word lines. After that, the same negative voltage pulse is inflicted to all the 32 word lines included in the subject erasure unit (S52). After that voltage pulse infliction, the threshold voltage of each subject cell is checked sequentially, starting from the word line W01 (S53). When there is a cell of which threshold voltage does not reach the reference value, the system goes to the next word line for another check (S54). When the threshold voltage of a cell has reached the reference value, the system goes to the next memory cell connected to the same word line (S55) and continues the check. When the threshold voltages of all the cells connected to the same word line have reached the reference value, the system stores the information of processing end "1" in the corresponding register (S56). After the check is completed for all the 32 word lines included in the subject erasure unit, an additional erasing processing is executed for the word line for which "0" is stored in the corresponding register. When "1" is set for all the values stored in the registers RES01 to RES32, the system executes the same erasing processings for the next erasure unit (S57).

The system then controls the latches LTC01 to LTC32 according to the information stored in the register RES so as to inflict −10V pulse voltage to the word lines which need additional processing and to inflict 0V to the word lines which doesn't need any additional processing, or to set those 32 word lines in the floating potential state, respectively. After that, the system checks the threshold voltage of the cell with respect to each word line to which an additional processing has been done. If the processing is not completed yet for any word line, the system stores "0" in the register corresponding to the word line address again. When the processing is completed for the word line, the system replaces "0" with "1" in the register. Repeating these processings, it is possible to reduce the number of word lines that require the additional erasing processing by increments, thereby reducing the check time more than the conventional block processing. In addition, because a voltage for reducing a threshold voltage is inflicted to only one word line in this embodiment, the threshold voltage distribution after a processing becomes equal to that of the sector processing. Consequently, it is possible to reduce the number of cells reaching the over erasing level that requires rewriting, up to that of the sector processing, thereby the rewriting time can be reduced.

Figure 6:
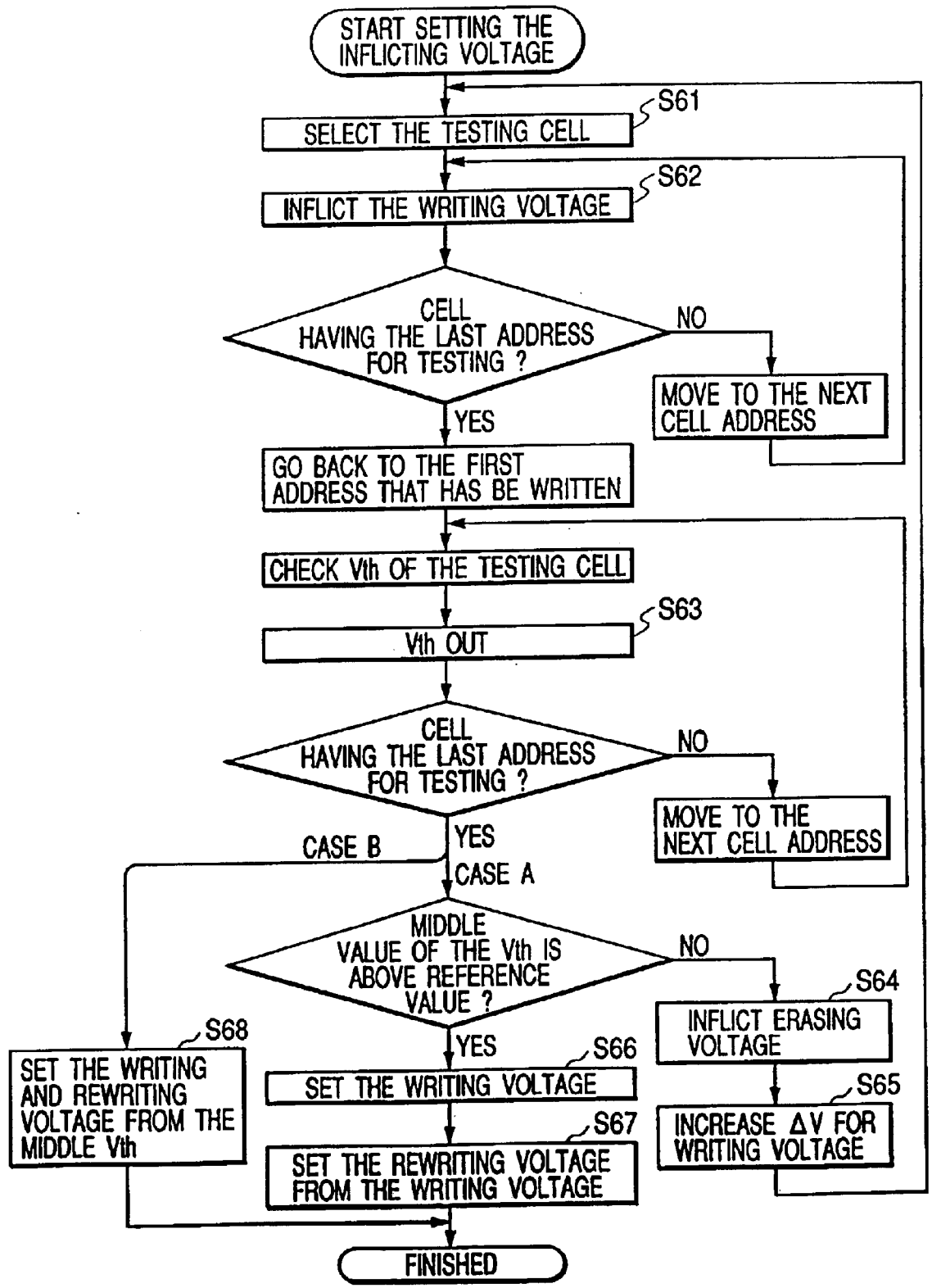
FIG. 6 is a flowchart of the processing of deciding a writing voltage and a rewriting voltage of the present invention.

FIG. 6 shows a flowchart for executing a rewriting voltage selecting method of the present invention. According to this method, a plurality of cells used for a voltage setting test are selected from a finished non-volatile memory beforehand (S61). Then, the minimum writing voltage to be estimated from the variation of the manufacturing characteristic is decided as the initial value of a voltage used for the test writing. At first, the initial value is written in all the cells to be tested (S62). Then, the threshold voltages are read from those cells (S63). Hereinafter, Case A and Case B are used as examples for choosing an inflicting voltage corresponding to the read threshold voltage.

In Case A, when the center value of the detected threshold voltages is under the reference value, e.g., the writing lower limit, the threshold voltages of the test cells are lowered once (S64). Then, the writing voltage is increased by ΔV from the initial voltage (S65), then the writing test is restarted so as to check the threshold voltages. Repeating these processings, the final inflicted voltage is decided as a voltage for the subject chip when the center value of the threshold voltages of the cells reaches the reference value (S66) after the writing. The rewriting voltage is selected as a value corresponding to the writing voltage selected here and decided for the subject chip (S67).

Unlike the Case A, no processing is repeated in Case B. A voltage to be inflicted to a chip is decided according to the information in a table of inflicting voltages verse the corresponding threshold voltages after the writing, the writing voltage, and the rewriting voltage, generated with the measured data in the writing test (S68). In any of the Cases A and B, the proper writing voltage and the proper rewriting voltage are decided for a chip according to the characteristic of each completed non-volatile memory.

While a rewriting voltage is decided for a chip according to the writing characteristic of the test cells, the rewriting voltage may be decided directly by evaluating the rewriting characteristic. The rewriting voltage may also be decided for each chip by varying the stepping voltage that increases by increments. In addition, the present invention applies the approach for the "writing" defined above to the "erasing", i.e. substituting the processing for increasing a threshold voltage in "erasing" with a processing for decreasing the threshold voltage in "writing".

Next, a method for reproducing proper voltage pulses selected in FIG. 6 with reference to FIG. 7 is described. A plurality of voltage pulse patterns are prepared beforehand. The pulse patterns are, for example, pulses with voltages different by an increment value of ΔV, i.e. pulses whose pulse widths are different from each other by a ΔV. For example, a plurality of proper voltage pulses look like those shown in FIG. 7F. In this example, a pattern is selected from the 64 predetermined types, and the initial voltage, the increment ΔV, the pulse width, the final target voltage, etc., are specified far the pulse pattern so as to reproduce the same sets of voltage inflicting conditions corresponding to the characteristic of each finished chip type. FIGS. 7A to 7D show the four types of sample pulse patterns. FIG. 7A shows a pulse voltage having a pulse width T001. The voltage pulse shown in FIG. 7A is selected as the initial pulse of a rewriting voltage, and VG00011 is specified as the initial value of the inflicting voltage. The voltage increment value is ΔV. The voltage to be inflicted in FIG. 7B begins with the pulse having a pulse width T011 at the inflicting voltage of VG00110. The voltage increment value is ΔV. The voltage to be inflicted in FIG. 7C begins with the pulse having a pulse width T110 at the inflicting voltage VG01001. The voltage increment value of the voltage in FIG. 7C is zero. The voltage is inflicted only by a specified number of times. The voltage to be inflicted in FIG. 7D begins with the pulse having a pulse width T110 at the inflicting voltage VG01010. The voltage increment value of the voltage in FIG. 7D is zero. After that, the pulse shown in FIG. 7D is used until the rewriting is completed. The reference pulses in FIGS. 7A–D are assembled into the Pattern in FIG. 7F.

Figure 7A:
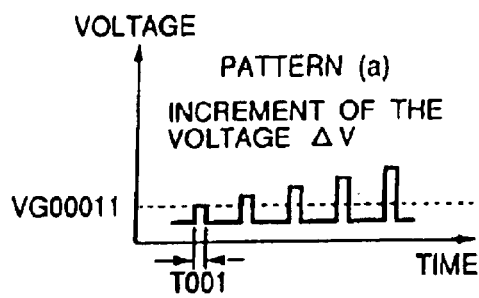
FIGS. 7A through 7D and 7F are patterns of voltage pulses inflicted for rewriting.
Figure 7C:
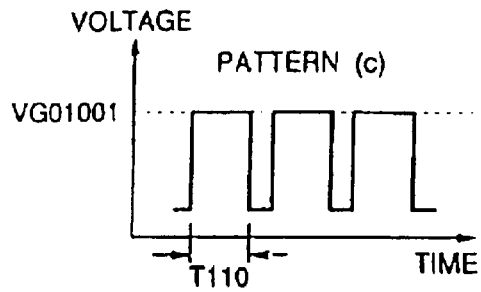
Figure 7B:
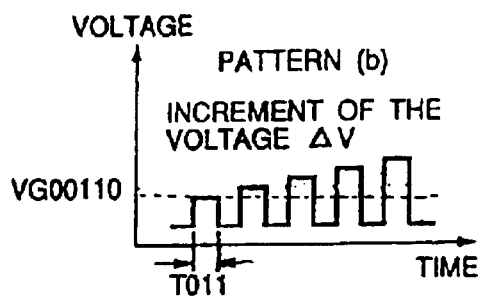
Figure 7D:
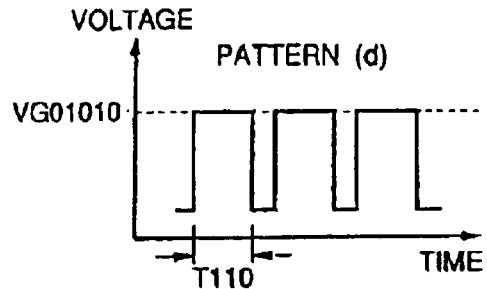
Figure 7E:
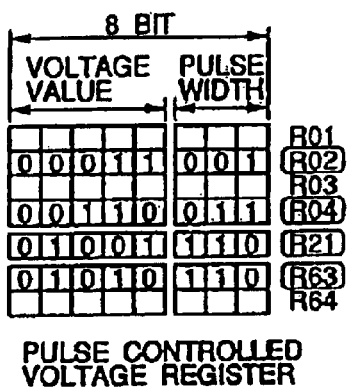
FIG. 7E is one example of the contents of a pulse controlled voltage register.
Figure 7F:
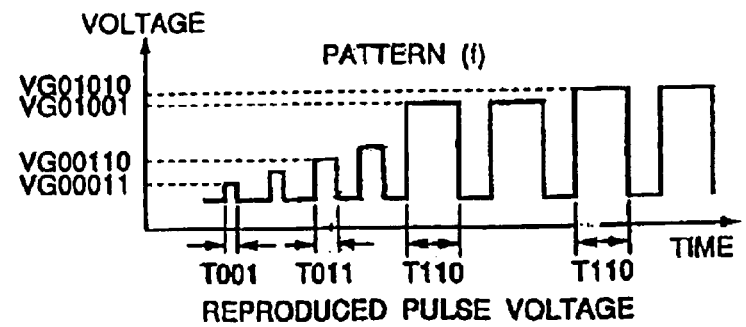

Each pre-prepared voltage pulse pattern as described above is stored in a pulse-controlled voltage register as specified information as shown in FIG. 7E. In the example shown in FIG. 7E, 5 bits are assigned to a voltage value and 3 bits are assigned for a pulse width. There are a total of 64 pulse patterns prepared. The specified four pulse patterns shown in FIG. 7A to FIG. 7D are stored in the registers R02, R04, R21, and R63 selected from the registers R01 to R64. The addresses of those four registers for storing specified pulse conditions are stored in the respective portions of the corresponding non-volatile memory array MM. The area used to store such information is an boot area from which the information is read whenever the system is powered. An operation voltage selected for each chip is selected from the voltage specification information stored in the corresponding register according to the register address read from the boot area when the system is powered.

Because a voltage inflicted for rewriting is selected according to the characteristics of each finished non-volatile memory, the erasing processing is done properly. For example, assuming that a non-volatile memory is finished and the average size of the finished memory ranges between 0.28 μm to 0.32 μm even when each cell is designed with a gate length of 0.3 μm. Consequently, a difference of 1V is often generated among inflicting voltages to support the same rewriting speed. In such a case, however, it is possible to select a proper inflicting voltage for each completed memory, so that the memory is assured to operate properly. In other words, when the information of a proper voltage pulse is stored in the finished non-volatile memory, the specified information is acknowledged by the system each time the system is powered.

The above method can apply to not only 'rewriting' but also 'writing'. When a voltage inflicted for writing is increased by increments, the minimum and maximum values of the writing voltage is varied to determine the minimum value, the maximum value, and the incremental voltages for each chip according to the test writing characteristic as described above. This method can also apply to erasing.

Figure 8:
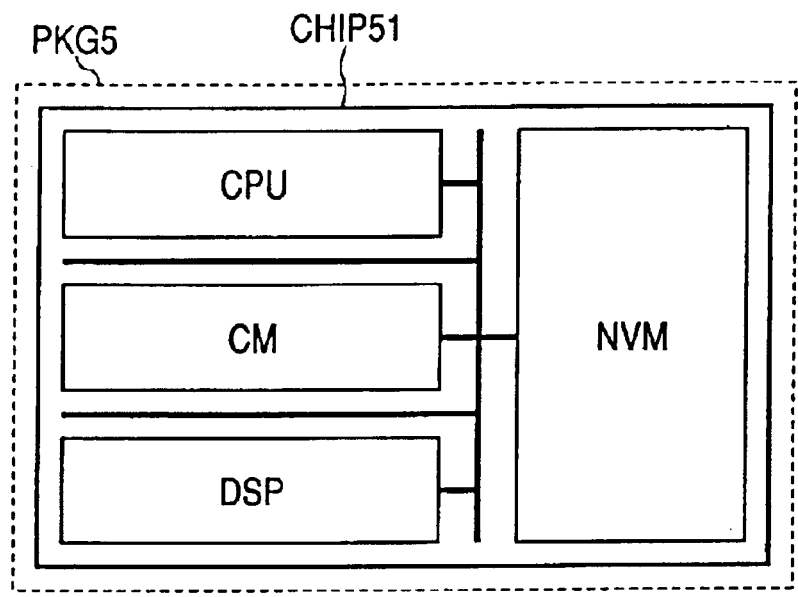
FIG. 8 is a block diagram of a semiconductor IC system provided with a non-volatile memory, which is mounted together with the IC system on the same board.

FIG. 8 shows a semiconductor IC system with a non-volatile memory which is mounted together with the IC system on the same board. The IC system includes a CPU, a cache CM, a digital signal processor DSP, and a non-volatile NVM that are connected one another via a bus and mounted on the same board. The CHIP 51 is sealed in one package PKG 5. The NVM in the semiconductor device is used for, for example, storing a program. By applying the present invention to this NVM, the semiconductor device can reduce the program updating time, i.e. the information rewriting time.

Figure 9:
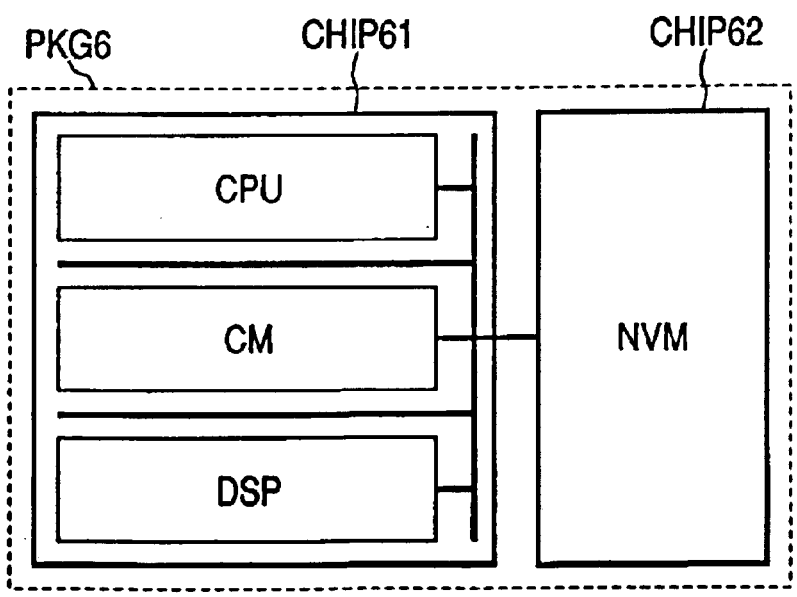
FIG. 9 is a block diagram of a semiconductor IC system provided with a nonvolatile memory, which is mounted together with the IC system in the same package.

FIG. 9 shows a semiconductor IC system composed of two chips CHIP 61 and CHIP 62 (NVM), which are mounted together with the IC system in the same package PKG 6. The configuration of the IC system is the same as that shown in FIG. 9. The IC system may includes other chips. Also in this case, by applying the present invention to the NVM, the semiconductor device can reduce the program updating time, i.e. information rewriting time. Although not shown in FIG. 9, CHIP 61 and CHIP 62 may be sealed in different packages. Also, it will be understood apparently that the present invention can apply to the NVM.

The present invention therefore achieves a short processing time, which is a feature of the block processing, and reduces the variation of the threshold voltage, which is a feature of the sector processing. Consequently, the present invention speeds up the whole erasing processing.

The foregoing invention has been described in terms of preferred embodiments. However, those skilled in the art will recognize that many variations of such embodiments exist. Such variations are intended to be within the scope of the present invention and the appended claims.

What is claimed is:

1. A method for erasing data from a non-volatile semiconductor memory device, comprising:

inflicting a plurality of erase pulse to a plurality of memory cells; and inflicting a plurality of write pulse to over erased memory cells;

wherein a voltage of said write pulse increases gradually.

2. A method for erasing data from a non-volatile semiconductor memory device according to claim 1, wherein a width of said write pulse increases gradually.

3. A method for erasing data from a non-volatile semiconductor memory device, comprising:

inflicting a plurality of erase pulse to a plurality of memory cells; and inflicting a plurality of write pulse to over erased memory cells;

wherein a width of said write pulse increases gradually.

* * * * *